(12) United States Patent
Nakajima

(10) Patent No.: US 7,695,574 B2
(45) Date of Patent: Apr. 13, 2010

(54) ALLOY CONTAINING RARE EARTH ELEMENT, PRODUCTION METHOD THEREOF, MAGNETOSTRICTIVE DEVICE, AND MAGNETIC REFRIGERANT MATERIAL

(75) Inventor: Kenichiro Nakajima, Chichibu (JP)

(73) Assignee: Showda Denko K.K., Minato-ku, Tokyo (JP)

( * ) Notice: Subject to any disclaimer, the term of this patent is extended or adjusted under 35 U.S.C. 154(b) by 1241 days.

(21) Appl. No.: 10/531,480

(22) PCT Filed: Oct. 22, 2003

(86) PCT No.: PCT/JP03/13494

§ 371 (c)(1), (2), (4) Date: Apr. 15, 2005

(87) PCT Pub. No.: WO2004/038055

PCT Pub. Date: May 6, 2004

(65) Prior Publication Data

US 2006/0076084 A1 Apr. 13, 2006

Related U.S. Application Data

(60) Provisional application No. 60/424,015, filed on Nov. 6, 2002, provisional application No. 60/488,095, filed on Jul. 18, 2003.

(30) Foreign Application Priority Data

Oct. 25, 2002 (JP) ............................. 2002-311213
Jun. 25, 2003 (JP) ............................. 2003-181364

(51) Int. Cl.
*H01F 1/047* (2006.01)
*H01F 1/055* (2006.01)

(52) U.S. Cl. .................. 148/301; 148/101; 148/121; 164/459; 164/463

(58) Field of Classification Search .................. None
See application file for complete search history.

(56) References Cited

U.S. PATENT DOCUMENTS 4,582,535 A * 4/1986 Buschow .................. 75/246
(Continued)

FOREIGN PATENT DOCUMENTS

JP 01-246342 A 10/1989
(Continued)

OTHER PUBLICATIONS

Maya Fujita et al, "Itinerant-Electron Metamagnetic La(Fe$_x$Si$_{1-x}$)$_{13}$ Compounds," *Solid-State Physics*, vol. 37, No. 6, (2002), p. 419-427.
(Continued)

*Primary Examiner*—John P. Sheehan
(74) *Attorney, Agent, or Firm*—Sughrue Mion, PLLC

(57) ABSTRACT

A method for producing an RE-containing alloy represented by formula $R(T_{1-x}A_x)13_{-y}$ (wherein R represents Ce, etc.; T represents Fe, etc.; and A represents Al, etc; $0.05 \leq x \leq 0.2$; and $-1 \leq y \leq 1$) including a melting step of melting alloy raw materials at 1,200 to 1,800° C.; and a solidification step of rapidly quenching the molten metal produced through the above step, to thereby form the first RE-containing alloy, wherein the solidification step is performed at a cooling rate of $10^2$ to $10^{4o}$ C./second, as measured at least within a range of the temperature of the molten metal to 900° C.; and an RE-containing alloy, which is represented by a compositional formula of $R_rT_tA_a$ (wherein R and A represent the same meaning as above, T represents Fe, etc.; 5.0 at. % $\leq r \leq$ 6.8 at. %, 73.8 at. % $\leq t \leq$ 88.7 at. %, and 4.6 at. % $\leq a \leq$ 19.4 at. %) and has an alloy microstructure containing an NaZn$_{13}$-type crystal structure in an amount of at least 85 mass % and α-Fe in an amount of 5-15 mass % inclusive.

10 Claims, 9 Drawing Sheets

U.S. PATENT DOCUMENTS

| | | | |
|---|---|---|---|
| 6,773,517 B2* | 8/2004 | Sakaki et al. | 148/303 |
| 7,004,228 B2* | 2/2006 | Murakami et al. | 164/463 |
| 7,014,718 B2* | 3/2006 | Hasegawa et al. | 148/302 |
| 2004/0079446 A1 | 4/2004 | Kogure et al. | |
| 2004/0194855 A1 | 10/2004 | Fukamichi et al. | |

FOREIGN PATENT DOCUMENTS

| | | |
|---|---|---|
| JP | 07-263210 | 10/1995 |
| JP | 2000-54086 A | 2/2000 |
| JP | 2002-064009 | 2/2002 |
| JP | 2002-69596 A | 3/2002 |
| JP | 2002-356748 A | 12/2002 |
| JP | 2003-96547 A | 4/2003 |
| JP | 2004-100043 A | 4/2004 |

OTHER PUBLICATIONS

Maya Fujita et al, "Large Volume and Magnetocaloric Effect of Itinerant-Electron Metamagnetic La(Fe$_x$Si$_{1-x}$)$_{13}$ Compounds," *Materia Japan*, vol. 41, No. 4, (2002), p. 269-275.

S. Fujieda et al, "Large Magnetic Magnetocaloric Effect in La(Fe$_x$Si$_{1-x}$)$_{13}$ Itinerant-Electron Metamagnetic Compounds," *App. Phys. Lett.*, vol. 81, No. 7, Aug. 2002, p. 1276-1278.

S. Fujieda et al, "Giant Isotropic Magnetostriction of Itinerant-Electron Metamagnetic La(Fe$_{0.88}$Si$_{0.12}$)$_{13}$H$_y$ Compounds", *App. Phys. Lett.*, vol. 79, No. 5, Jul. 2001, p. 653-655.

Chang, et al., "Theoretical study of phase forming of NaZn$_{13}$-type rare-earth intermetallics," *Journal of Physics: Condensed Matter 15*:109-120 (2003) XP002385787.

Hu, et al., "Magnetic entropy change and its temperature variation in compounds La(Fe$_{1-x}$CO$_x$)$_{11.2}$Si$_{1.8}$," *Journal of Applied Physics 92*:3620-3623 (2002) XP012057320.

Zhang, et al., "Magnetic entropy change in Fe-based compound LaFe$_{10.6}$Si$_{2.4}$," *Applied Physics Letters 77*:3072-3074 (2000) XP012026561.

Office Action issued on Japanese Application No. 2003-349682 with English translation.

* cited by examiner

ALLOY CONTAINING RARE EARTH ELEMENT, PRODUCTION METHOD THEREOF, MAGNETOSTRICTIVE DEVICE, AND MAGNETIC REFRIGERANT MATERIAL

CROSS-REFERENCE TO RELATED APPLICATIONS

This application claims the benefit pursuant to 35 U.S.C. §119(e)(1) of U.S. Provisional Applications, No. 60/424,015 filed Nov. 6, 2002 and No. 60/488,095 filed Jul. 18, 2003.

TECHNICAL FIELD

The present invention relates to a method for producing an alloy containing a rare earth element (hereinafter referred to as RE-containing alloy), to an RE-containing alloy, to a method for producing an RE-containing alloy powder, to an RE-containing alloy powder, to a method for producing a sintered RE-containing alloy, to a sintered RE-containing alloy, to a magnetostrictive device, and to a magnetic refrigerant. More particularly, the invention relates to a technique for producing an $NaZn_{13}$-type RE-containing alloy which is suitable for producing a magnetostrictive device, a magnetic refrigerant, etc.

BACKGROUND ART

Magnetostrictive devices, which generate strain through application of a magnetic field, are employed as magnetostrictive sensors, magnetostrictive vibrators, and similar devices for generating or detecting displacement with precision. Conventionally, RE-containing intermetallic compounds such as $TbFe_2$, $DyFe_2$, and $SmFe_2$ are employed as magnetostrictive materials. However, these intermetallic compounds generate only minute displacement, and precise control of the generated displacement is difficult. Therefore, these compounds cannot be applied to magneto-displacement devices for controlling minute displacement.

Meanwhile, GGG (gallium gadolinium garnet) is known to be a magnetic refrigerant which may be applicable to magnetic refrigerators or similar devices. However, GGG has not yet been used in a commercial product, because of its poor refrigeration efficiency upon application of a weak magnetic field provided by a permanent magnet.

In recent years, an RE-containing alloy having an $NaZn_{13}$ phase (hereinafter referred to as "$NaZn_{13}$-type RE-containing alloy") has been found to exhibit large magnetostrain and high magnetocaloric effect. By virtue of these properties, this type of alloy is thought to be a candidate magnetostrictive material, magnetic refrigerant, etc.

Specifically, $La(Fe_aSi_{1-a})_{13}$ ($0.84 \leq a \leq 0.88$) is disclosed to exhibit a magnetostrain as large as about 0.4% at 200 K under $\geq 4T$ (see, for example, non-patent reference 1).

It is also disclosed that, when the above compound is transformed into $La(Fe_aSi_{1-a})_{13}H_b$ ($0.84 \leq a \leq 0.88$, $1.0 \leq b \leq 1.6$) through hydrogen absorption or similar treatment, Curie temperature can be controlled and magnetocaloric effect can be maintained at a high level (see, for example, non-patent reference 2).

Conventionally, $NaZn_{13}$-type RE-containing alloys such as $La(Fe_aSi_{1-a})_{13}$ ($0.84 \leq a \leq 0.88$) have been produced by weighing alloy raw materials such as high-purity La, Fe, Si, etc., so as to attain a desired alloy composition and mixing; melting the mixture through arc melting; and heating the product for a considerably long period of time (e.g., at 1,050° C. for 1,000 hours) in order to remove an undesired phase (see, for example, non-patent reference 2).

In the conventional method for producing $NaZn_{13}$-type RE-containing alloys, the long-term heat treatment step for removing an undesired phase lowers productivity and increases costs in the production of $NaZn_{13}$-type RE-containing alloys, devices employing the alloys, and other products employing the alloys.

Among RE-containing alloys having an $NaZn_{13}$ structure, an La—Fe—Si alloy has been found to exhibit magnetic phase transition concomitant with a large entropy change in accordance with a change in the external magnetic field and to have no temperature hysteresis in the magnetocaloric effect. By virtue of these properties, this type of alloy is considered a candidate magnetic refrigerant.

The magnetic phase transition temperature of the La—Fe—Si alloy can be controlled by absorbing hydrogen into the alloy, and the change in entropy does not decrease even when hydrogen is absorbed (see non-patent reference 2). Therefore, when the magnetic phase transition temperature of the alloy is controlled to approximately room temperature and a permanent magnet is employed to generate a magnetic field, the alloy can be used as a magnetic refrigerant which can work at about room temperature.

In addition, this type of alloy, which exhibits a large, isotropic volume change under application of an external magnetic field, is also considered a candidate magnetostrictive material (see non-patent reference 1).

A conventionally known method for producing an La—Fe—Si alloy having an $NaZn_{13}$ structure includes arc-melting raw material metals (i.e., La, Fe, and Si), to thereby form an alloy ingot; heating the alloy ingot in an inert atmosphere at 1,000 to 1,200° C. for 240 hours to 1,000 hours, to thereby form a mother alloy; re-melting the mother alloy; atomizing the formed molten alloy in an atmosphere for cooling, to thereby produce spherical particles; and absorbing hydrogen into the particles, to thereby control the magnetic phase transition temperature to a predetermined level (see patent reference 1).

However, the aforementioned conventional method for producing an RE-containing alloy powder has a drawback. Namely, since the method includes a long-term heat treatment and two melting steps, production costs increase and oxygen content of the alloy increases, even though low-cost material is used.

[Non-Patent Reference 1]
Maya FUJITA and Kazuaki FUKAMICHI, Itinerant-Electron Metamagnetic $La(Fe_xSi_{1-x})_{13}$ Compounds, "Solid-State Physics," Vol. 37, No. 6, (2002), p. 419-427

[Non-Patent Reference 2]
Maya FUJITA, Shun FUJIEDA, and Kazuaki FUKAMICHI, Large Magnetic Volume and Magnetocaloric Effect of Itinerant-Electron Metamagnetic $La(Fe_xSi_{1-x})_{13}$ Compounds, "Materia," Vol. 41, No. 4, (2002), p. 269-275

[Patent Reference 1]
Specification of Japanese Patent Application Laid-Open (kokai) No. 2003-96547

[Problems to be Solved by the Invention]

The present invention has been conceived under such circumstances. Thus, an object of the present invention is to provide a technique capable of producing an $NaZn_{13}$-type RE-containing alloy at high efficiency without performing a long-period heat treatment step. Another object of the invention is to provide an $NaZn_{13}$-type RE-containing alloy produced through the technique. Still another object of the invention is to provide a magnetostrictive device fabricated from the $NaZn_{13}$-type RE-containing alloy. Yet another object of the invention is to provide a magnetic refrigerant produced from the $NaZn_{13}$-type RE-containing alloy.

In addition, an object of the present invention is to provide an RE-containing alloy powder which is easily pulverizable, is not too brittle, and can be produced at low cost, within a short time, and without increasing the oxygen content of the RE-containing alloy powder or a sintered product of the alloy which is employed as a magnetic refrigerant or a magnetostrictive material.

The present inventor has carried out extensive studies in order to solve the aforementioned problem, and has discovered the following method for producing an RE-containing alloy, an RE-containing alloy, a method for producing an RE-containing alloy powder, an RE-containing alloy powder, a method for producing a sintered RE-containing alloy, a sintered RE-containing alloy, a magnetostrictive device, and a magnetic refrigerant.

The present invention comprises the following items (1) to (22).

(1) A first method for producing a first RE-containing alloy represented by formula $R(T_{1-x}A_x)_{13-y}$ (wherein R represents at least one species selected from among La, Ce, Pr, Nd, Sm, Eu, Th, Dy, Ho, Tm, Yb, Gd, and Lu; T represents at least one species selected from among Fe, Co, Ni, Mn, Pt, and Pd; and A represents at least one species selected from among Al, As, Si, Ga, Ge, Mn, Sn, and Sb ($0.05 \leq x \leq 0.2$; and $-1 \leq y \leq 1$)) comprising a melting step of melting alloy raw materials at 1,200 to 1,800° C.; and a solidification step of rapidly quenching the molten metal produced through the above step, to thereby form the first RE-containing alloy, wherein the solidification step is performed at a cooling rate of $10^2$ to $10^{4°}$ C./second, as measured at least within a range of the temperature of the molten metal to 900° C.

(2) The method for producing an RE-containing alloy according to (1), wherein, in the melting step, the alloy raw material is melted in an inert gas atmosphere at 0.1 to 0.2 MPa.

(3) A method for producing the first RE-containing alloy according to (1), wherein in the solidification step, the molten metal is rapid-quenched through any of strip casting, new centrifugal casting, and centrifugal casting.

(4) A method for producing the first RE-containing alloy according to (3), wherein the molten metal is rapidly quenched through strip casting in the solidification step, to obtain strips having a thickness of 0.1 to 2.0 mm.

(5) A second method for producing a second RE-containing alloy comprising a melting step and a solidification step for producing a first RE-containing alloy according to (1), and a heat treatment step of heating at 900 to 1,200° C. the first RE-containing alloy that is produced through the solidification step, to thereby form an $NaZn_{13}$ phase.

(6) The second method for producing a second RE-containing alloy according to (5), wherein the $NaZn_{13}$ phase is formed through the heat treatment step, which is performed for a period of from one minute to 200 hours.

(7) The second method for producing a second RE-containing alloy according to (6), wherein the heat treatment is performed at a temperature of 1080° C. to 1200° C. and for a period of from 3 to 42 hours.

(8) The first RE-containing alloy which is obtainable through the method of any one of (1) to (4).

Through the first methods of the present invention for producing a first RE-containing alloy (that is the above (1) to (4)), an RE-containing alloy suitably used for producing an $NaZn_{13}$-type RE-containing alloys (i.e., a starting alloy for an $NaZn_{13}$-type RE-containing alloy) are produced. $NaZn_{13}$-type RE-containing alloys are produced through the second methods of the present invention for producing RE-containing alloys ((5) and (6)).

(9) A first RE-containing alloy, which is represented by formula $R(T_{1-x}A_x)_{13-y}$ (wherein R represents at least one species selected from among La, Ce, Pr, Nd, Sm, Eu, Tb, Dy, Ho, Tm, Yb, Gd, and Lu; T represents at least one species selected from among Fe, Co, Ni, Mn, Pt, and Pd; and A represents at least one species selected from among Al, As, Si, Ga, Ge, Mn, Sn, and Sb ($0.05 \leq x \leq 0.2$; and $-1 \leq y \leq 1$)), and which comprises an R-rich phase, having a relatively high rare earth metal (R) content, and an R-poor phase, having a relatively low rare earth metal (R) content, wherein the R-rich phase and the R-poor phase are dispersed at a phase spacing of 0.01 to 100 μm.

In the present specification, the R-rich phase spacing, the R-poor phase spacing, and the size of each phase are evaluated by use of back-scattered electron images of the alloy observed under a scanning electron microscope.

In a back-scattered electron image of the alloy, a portion having a large average atomic weight is observed as a white image, whereas a portion having a small average atomic weight is observed as a black image. In other words, the R-rich phase is observed as a white image, and the R-poor phase, having a rare earth metal content lower than that of the R-rich phase, is observed as a gray image. In a specific procedure, a back-scattered electron image of an alloy sample is taken at an appropriate magnification as a rectangular image, and the image data are converted to two values corresponding to black and white by use of image processing software. Subsequently, a lateral segment and a longitudinal segment through the center, and two diagonals (total four segments) are drawn in the rectangular image. The total lengths of the white portions that intersect each segment are measured, and the four measured lengths are averaged, to thereby derive the size of the R-rich phase (i.e., equivalent to R-poor phase spacing). In a similar manner, the total length of the black portions that intersect each segment is measured, and the four measured lengths are averaged, to thereby derive the size of the R-poor phase (i.e., equivalent to R-rich phase spacing).

(10) A second RE-containing alloy, which is represented by formula $R(T_{1-x}A_x)_{13-y}$ (wherein R represents at least one species selected from among La, Ce, Pr, Nd, Sm, Eu, Tb, Dy, Ho, Tm, Yb, Gd, and Lu; T represents at least one species selected from among Fe, Co, Ni, Mn, Pt, and Pd; and A represents at least one species selected from among Al, As, Si, Ga, Ge, Mn, Sn, and Sb ($0.05 \leq x \leq 0.2$; and $-1 \leq y \leq 1$)), wherein the alloy has an $NaZn_{13}$ phase content of at least 90 vol. %.

(11) A magnetostrictive device provided from the second RE-containing alloy according to (10).

(12) A magnetic refrigerant provided from the second RE-containing alloy according to (10).

The magnetostrictive device and magnetic refrigerant of the present invention are characterized by being produced from the aforementioned second RE-containing alloy of the present invention (an $NaZn_{13}$-type RE-containing alloy).

(13) An RE-containing alloy, which is represented by a compositional formula of $R_rT_tA_a$ (wherein R represents at least one rare earth element selected from among La, Ce, Pr, Nd, Sm, Eu, Tb, Dy, Ho, Tm, Yb, Gd, and Lu; T collectively represents transition metal elements containing at least Fe atoms, a portion of the Fe atoms being optionally substituted by at least one species selected from among Co, Ni, Mn, Pt, and Pd; A represents at least one element selected from among Al, As, Si, Ga, Ge, Mn, Sn, and Sb; and r, t, and a have the following relationships: 5.0 at. % $\leq r \leq$ 6.8 at. %, 73.8 at.

%≦t≦88.7 at. %, and 4.6 at. %≦a≦19.4 at. %) and having an alloy microstructure containing an NaZn$_{13}$-type crystal structure in an amount of at least 85 mass % and α-Fe in an amount of 5-15 mass % inclusive.

(14) A method for producing an RE-containing alloy powder, comprising pulverizing, by mechanical means, the RE-containing alloy according to (13) to a powder having a mean particle size of 0.1 μm to 1.0 mm.

(15) An RE-containing alloy powder comprising an RE-containing alloy according to (13), which has a mean particle size of 0.1 μm to 1.0 mm.

(16) A magnetic refrigerant comprising the sintered RE-containing alloy powder according to (15), wherein the Curie temperature of the magnetic refrigerant has been controlled through absorption of hydrogen in the sintered RE-containing alloy.

(17) A method for producing a sintered RE-containing alloy, which comprises compacting an RE-containing alloy powder produced through a method for producing an RE-containing alloy powder as described in (14), and sintering the compact.

(18) The method for producing a sintered RE-containing alloy described in (17), wherein the sintering is performed at 1,200° C. to 1,400° C.

(19) The method for producing a sintered RE-containing alloy described in (17) or (18), wherein, after completion of sintering the RE-containing alloy powder, the sintered alloy is maintained in a hydrogen atmosphere at 200° C. to 300° C., to thereby absorb hydrogen into the sintered alloy.

(20) A sintered RE-containing alloy, which is formed by compacting the RE-containing alloy powder as recited in (15), and sintering the compact.

(21) A magnetostrictive material comprising the sintered RE-containing alloy as recited in (20), wherein the Curie temperature of the magnetostrictive material has been controlled through absorption of hydrogen into the sintered RE-containing alloy.

(22) A magnetic refrigerant comprising the sintered RE-containing alloy as recited in (20), wherein the Curie temperature of the magnetic refrigerant has been controlled through absorption of hydrogen into the sintered RE-containing alloy.

According to the present invention, there can be provided a technique capable of producing an NaZn$_{13}$-type RE-containing alloy at high efficiency without performing long-term heat treatment; an NaZn$_{13}$-type RE-containing alloy produced through the technique; and a magnetostrictive device and a magnetic refrigerant obtained from the NaZn$_{13}$-type RE-containing alloy.

Further, according to the present invention, a magnetostrictive material and a magnetic refrigerant formed of an RE-containing alloy (e.g., La—Fe—Si) having an NaZn$_{13}$ structure can be reliably produced at low cost, compared with conventional methods. The present invention contributes toward mass production of magnetic refrigerator and magnetostrictive devices.

BEST MODE FOR CARRYING OUT THE INVENTION

Figure 1:
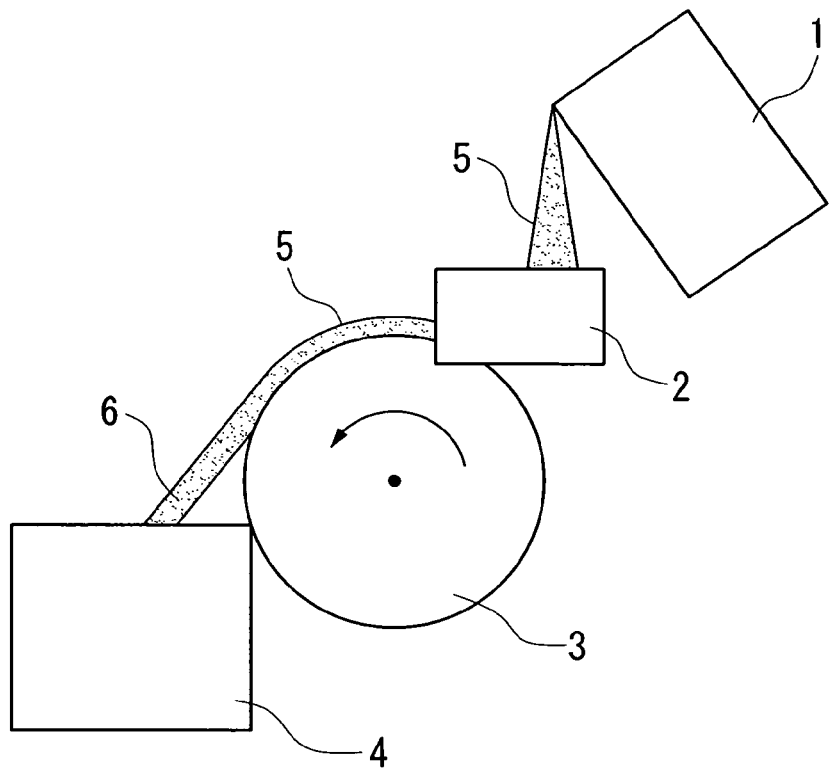
FIG. 1 shows a typical production apparatus suitably used in the first method of the present invention for producing an RE-containing alloy.

[First Method for Producing a First RE-Containing Alloy]

The first method of the present invention for producing a first RE-containing alloy is directed to a method for producing a starting alloy (the first RE-containing alloy) for an NaZn$_{13}$-type RE-containing alloy that is represented by formula R(T$_{1-x}$A$_x$)$_{13-y}$ (wherein R represents at least one rare earth metal selected from among La, Ce, Pr, Nd, Sm, Eu, Tb, Dy, Ho, Tm, Yb, Gd, and Lu; T represents at least one transition metal selected from among Fe, Co, Ni, Mn, Pt, and Pd; and A represents at least one element selected from among Al, As, Si, Ga, Ge, Mn, Sn, and Sb (0.05≦x≦0.2; and −1≦y≦1)).

The method generally includes a melting step (1) of melting an alloy raw material; and a solidification step (2) of solidifying the molten metal produced through the above step, to thereby form an RE-containing alloy (the first RE-containing alloy), wherein the solidification is performed through the "rapid quenching method."

Each step will next be described in detail.

<Melting Step>

In the melting step, alloy raw materials; i.e., materials containing a rare earth metal (R), a transition metal (T), and an element (A), respectively, are mixed, and the mixture is melted.

No particular limitation is imposed on the material containing a rare earth element (R), so long as the material predominantly contains at least one species selected from among La, Ce, Pr, Nd, Sm, Eu, Th, Dy, Ho, Tm, Yb, Gd, and Lu. Examples of such materials which can be employed include rare earth metals (purity: ≧90 mass %, the balance being unavoidable impurities such as Al, Fe, Mo, W, C, O, or N) and misch metals predominantly containing La, Ce, etc. (rare earth metal content: $\geqq 90$ mass %, the balance being unavoidable impurities such as Al, Fe, Mo, W, C, O, or N).

No particular limitation is imposed on the material containing a transition metal (T), so long as the material predominantly contains at least one species selected from among Fe, Co, Ni, Mn, Pt, and Pd. Examples of such materials which can be employed include pure metals such as Fe, Co, and Ni (purity: $\geqq 99$ mass %).

No particular limitation is imposed on the material containing an element (A), so long as the material predominantly contains at least one species selected from among Al, As, Si, Ga, Ge, Mn, Sn, and Sb. Examples of such materials which can be employed include metallic silicon (purity: $\geqq 95$ mass %, the balance being unavoidable impurities such as Pb, As, Fe, Cu, Bi, Ni, C, O, or N), metallic Ga, and pure Al.

These materials containing a rare earth metal (R), a transition metal (T), and an element (A), respectively, are weighed so as to attain an alloy composition represented by formula $R(T_{1-x}A_x)_{13-y}$, ($0.05 \leqq x \leqq 0.2$; and $-1 \leqq y \leqq 1$), followed by mixing.

Specifically, when an alloy of $La(Fe_{0.88}Si_{0.12})_{13}$ is to be produced, the compositional proportions in terms of La, Fe, and Si contained in the raw materials preferably fall within the ranges of 16.8 to 17.3 mass %, 78.3 to 80.1 mass %, and 4.8 to 5.0 mass %, respectively.

The thus-produced alloy material mixture is melted by heating at 1,200 to 1,800° C. The melting is preferably performed in an inert gas atmosphere at 0.1 MPa (atmospheric pressure) to 0.2 MPa Examples of the inert gas include Ar and He.

A heating temperature lower than 1,200° C. is not preferred because an undesired phase other than the R-rich phase and the R-poor phase may be formed, whereas a heating temperature higher than 1,800° C. is not preferred, because vaporization of a rare earth metal is promoted excessively, leading to difficulty in controlling the alloy composition. An inert gas atmosphere pressure lower than 0.1 MPa is not preferred, because vaporization of a rare earth metal is promoted excessively, leading to difficulty in controlling the alloy composition, whereas an inert gas atmosphere pressure higher than 0.2 MPa is not preferred, because the inert gas tends to migrate into the molten metal, thereby yielding an alloy having a large number of pores.

<Solidification Step>

In the solidification step, the molten metal produced through the above melting step is rapidly quenched, to thereby form an RE-containing alloy. Rapid quenching may be performed through strip casting, new centrifugal casting (employing a tundish of a rotatable disk type), centrifugal casting, or a similar method.

According to the present invention, the solidification step is performed at a cooling rate of $10^2$ to $10^{4\circ}$ C./second, preferably $5 \times 10^2$ to $3 \times 10^{3\circ}$ C./second, as measured at least within a range of the temperature of the molten metal to 900° C.

The present inventor has found that a uniform alloy metallographic microstructure which includes a crystalline phase can be formed by controlling the cooling rate in the above manner. More specifically, the inventor has found that there can be produced an RE-containing alloy which includes an R-rich phase (relatively high rare earth metal (R) content) and an R-poor phase (relatively low rare earth metal (R) content), with each phase being minute and being dispersed at a small phase spacing of 0.01 to 100 µm.

The inventor has also found that the R-rich phase and the R-poor phase are transformed into an $NaZn_{13}$ phase by heating the RE-containing alloy within a period of time as short as 200 hours or less, to thereby effectively produce an $NaZn_{13}$-type RE-containing alloy. The reason for the effective production of the alloy is that atoms for forming the $NaZn_{13}$ phase are effectively diffused, to thereby complete $NaZn_{13}$ phase formation within a shorter period than in conventional methods.

When the cooling rate as measured within a range of the temperature of the molten metal to 900° C. is less than $10^{2\circ}$ C./second, the size and phase spacing of the R-rich phase and the R-poor phase increases, leading to difficulty in formation of a uniform $NaZn_{13}$ phase through heat treatment, although an alloy microstructure including the R-rich phase and the R-poor phase is formed. When the cooling rate as measured within the same range is more than $10^{4\circ}$ C./second, the formed alloy microstructure includes an amorphous phase containing a transition metal (T), leading to considerable deterioration in pulverization and processing characteristics. These two cases are not preferred.

<Production Apparatus>

With reference to FIG. 1, an exemplary production apparatus suitably used in the first method of the present invention for producing an RE-containing alloy will be briefly described, taking as an example the case in which rapid quenching is performed through the strip casting method.

FIG. 1 shows the above apparatus including a crucible 1, a tundish 2, a cooling roller 3, and a receiving box 4.

In the apparatus, alloy raw materials are melted in the crucible 1, whereby a molten metal 5 is formed.

The formed molten metal 5 is poured via the tundish 2 onto the cylindrical cooling roller 3, which is rotating in a predetermined direction (counterclockwise in FIG. 1). The cooling roller 3 is formed of a copper roller or the like cooled by water or a similar medium. The molten metal 5 is rapidly quenched to 900° C. or lower through contact with the roller, to thereby form an alloy. The rate for cooling the molten metal 5 can be regulated by modifying the rotating speed (as represented by peripheral velocity) of the cooling roller 3; modifying the amount of the molten metal poured onto the cooling roller 3; or modifying a similar parameter.

The thus-formed alloy is removed from the cooling roller 3 in the form of strips 6, which are collected into the receiving box 4. According to the present invention, the thickness of the formed alloy strips 6 is preferably regulated to 0.1 to 2.0 mm by modifying the amount of the molten metal poured onto the cooling roller 3 or a similar parameter. Regulation of the thickness of the alloy strips 6 within the above range provides an RE-containing alloy which is formed of an R-rich phase and an R-poor phase, the phases having a minute size and being dispersed at a minute phase spacing, and which has an excellent pulverization characteristic.

The thus-collected strips 6 are cooled in the receiving box 4 to room temperature, and then removed from the receiving box. In this case, the rate of cooling the alloy collected in the receiving box 4 is preferably controlled through thermal insulation or forced cooling of the receiving box 4. Thus, by controlling the rate at which the alloy is cooled to room temperature performed after the alloy is cooled to 900° C. or lower by means of the cooling roller 3, uniformity in the alloy microstructure can be further enhanced.

[Second Method for Producing a Second RE-Containing Alloy]

The second method of the present invention for producing an RE-containing alloy is directed to a method for producing an $NaZn_{13}$-type RE-containing alloy from a starting alloy for an NaZn$_{13}$-type RE-containing alloy produced through the first method for producing an RE-containing alloy.

The production method includes a heat treatment step (3) of heating the starting alloy for NaZn$_{13}$-type RE-containing alloy that is produced through the aforementioned first method. More specifically, the heat treatment step includes heating at 900 to 1,200° C. the starting alloy for NaZn$_{13}$-type RE-containing alloy that is produced through the aforementioned first method, to thereby form an NaZn$_{13}$ phase. The heat treatment is preferably performed under reduced pressure or in vacuum.

The present inventor has found that the R-rich phase and the R-poor phase are transformed into an NaZn$_{13}$ phase by heating the RE-containing alloy at 900 to 1,200° C. for a short period of time falling within a range of one minute to 200 hours, to thereby produce an NaZn$_{13}$-type RE-containing alloy at remarkably high efficiency. The inventor has also found that the produced NaZn$_{13}$-type RE-containing alloy has an NaZn$_{13}$ phase content of at least 90 vol. %.

The ratio of the volume of NaZn$_{13}$ phase contained in the alloy to that of non-NaZn$_{13}$ phase(s) can be determined by identifying each crystal phase through powder x-ray diffractometry; calculating the ratio of "area of the NaZn$_{13}$ phase" to "area exhibiting contrast differing from that of the NaZn$_{13}$ phase," on the basis of a back-scattered electron image observed under a scanning electron microscope; and converting the area ratio to the corresponding volume ratio.

When the heat treatment temperature is lower than 900° C., a uniform NaZn$_{13}$ phase cannot be formed even when the heat treatment is performed for 200 hours or longer. When the temperature is higher than 1,200° C., the NaZn$_{13}$ phase may be separated to form an undesired phase. Both cases are not preferred.

As described in detail hereinabove, the method according to the present invention includes rapid quenching, under predetermined conditions, of the molten metal produced by melting raw materials. Therefore, the method provides a starting alloy for an NaZn$_{13}$-type RE-containing alloy having an alloy microstructure in which an R-rich phase and an R-poor phase are minutely and uniformly dispersed and being suitable for producing an NaZn$_{13}$-type RE-containing alloy. From the starting alloy, an NaZn$_{13}$-type RE-containing alloy can be produced through heat treatment for a short period of time of 200 hours or less.

Thus, according to the present invention, productivity in the production of an NaZn$_{13}$-type RE-containing alloy and devices and other products fabricated by use of the alloy can be remarkably enhanced, and production costs can be remarkably reduced.

In addition, the starting alloy in which the R-rich phase and the R-poor phase are minutely and uniformly dispersed also has an excellent pulverization characteristic. Therefore, the starting alloy has excellent processability and is readily formed into a desired shape through pulverization, compacting, and sintering. Thus, an NaZn$_{13}$-type RE-containing alloy product having a desired shape can be readily produced from the corresponding starting alloy of the same shape.

According to the present invention, a high-quality NaZn$_{13}$-type RE-containing alloy having an NaZn$_{13}$ phase content of 90 vol. % or higher can be provided. Thus, from the NaZn$_{13}$-type RE-containing alloy, high-performance magnetostrictive devices and magnetic refrigerants can be provided.

[A Third RE-Containing Alloy, an Alloy Powder Comprising the Third RE-Containing Alloy, and a Method for Producing the Alloy Powder]

The present invention is also directed to a third RE-containing alloy comprising a rare earth element R (wherein R represents at least one species selected from among La, Ce, Pr, Nd, Sm, Eu, Tb, Dy, Ho, Tm, Yb, Gd, and Lu); a transition metal element T (wherein T collectively represents transition metal elements containing at least Fe atoms, a portion of the Fe atoms being optionally substituted by at least one species selected from among Co, Ni, Mn, Pt, and Pd); and other elements A (wherein A represents at least one species selected from among Al, As, Si, Ga, Ge, Mn, Sn, and Sb); having a composition (atomic percentage of R, T, and A represented by r, t, and a, which have the following relationships: 5.0 at. %≦r≦6.8 at. %, 73.8 at. %≦t≦88.7 at. %, and 4.6 at. %≦a≦19.4 at. %), and having an alloy microstructure containing an NaZn$_{13}$-type crystal structure in an amount of at least 85 mass %. The invention is also directed to an alloy powder comprising the RE-containing alloy, and a method for producing the alloy powder.

In the third RE-containing alloy according to the present invention, the aforementioned rare earth elements R, transition metal elements T, and other elements A are essential for producing an alloy having an NaZn$_{13}$-type crystal structure.

Conventionally, compositional proportions (rare earth element R, transition metal element T, and other element(s) A) suitable for producing the above alloy are considered to be the following: 5.5 at. %≦r≦7.1 at. %, 73.8 at. %≦t≦88.7 at. %, and 4.6 at. %≦a≦19.4 at. %. Theoretical compositional proportions of r, t, and a in the aforementioned formula for producing the alloy having an NaZn$_{13}$-type crystal structure are represented by r: (t+a)=1:13; i.e., r is 7.1 at. %.

However, according to the present invention, the proportion of the rare earth element R contained in the alloy is regulated to 5.0 at. %≦r≦6.8 at. %, which is less than the theoretical range. As a result, α-Fe remains in the RE-containing alloy in an amount of 5 mass % or more, whereby mechanical strength of the sintered RE-containing alloy which has undergone hydrogen absorption can be maintained.

Notably, the third RE-containing alloy according to the present invention in some cases contains impurities such as O, C, and N. In such a case, the amount of each impurity; i.e., O, C, or N, is preferably 1 mass % or less and as small as possible.

The third RE-containing alloy according to the present invention is preferably cast through rapid quenching so as to conveniently form, through heat treatment, an RE-containing alloy having an alloy microstructure containing an NaZn$_{13}$-type crystal structure in an amount of at least 85 mass %. Examples of rapid quenching methods include strip casting (SC) and centrifugal casting. Taking the SC method as an example, casting of the RE-containing alloy according to the present invention will be described in detail.

According to the method for producing the third RE-containing alloy according to the present invention, the alloy raw material is melted in the crucible 1 at 1,500° C. to 1,800° C. under inert gas such as Ar or He. The molten alloy 5, prepared by melting the alloy raw material, is poured via the tundish 2 onto the copper roller 3, which is cooled by water and is rotating in a direction indicated by the arrow shown in FIG. 1, to thereby rapidly quench the alloy. During this process, the cooling rate, as measured within a range of the temperature of the molten alloy to 900° C., is controlled to $10^2$ to $10^{4°}$ C./second, preferably to $5\times10^{2°}$ C./second to $3\times10^{3°}$ C./second. By controlling the cooling rate in such a manner, a uniform alloy micro-structure having a crystalline phase can be readily formed. The thus-produced alloy may also be called "RE-containing alloy which has not yet undergone heat treatment."

When the cooling rate is less than $10^{2°}$ C./second, the R-rich phase spacing, the R-poor phase spacing, and the size of each phase increase. In this case, even when a subsequent heat treatment is performed, a uniform $NaZn_{13}$-type crystal structure is difficult to form. When the cooling rate is in excess of $10^{4\circ}$ C./second, the formed alloy assumes a mixture of amorphous metal and Fe, resulting in poor productivity. Both cases are not preferred. The molten alloy cooling rate can be controlled to a desired value by modifying the rotating speed (as represented by peripheral velocity) of the copper roller 3 or by modifying the amount of the molten alloy poured onto the copper roller 3.

Figure 2:
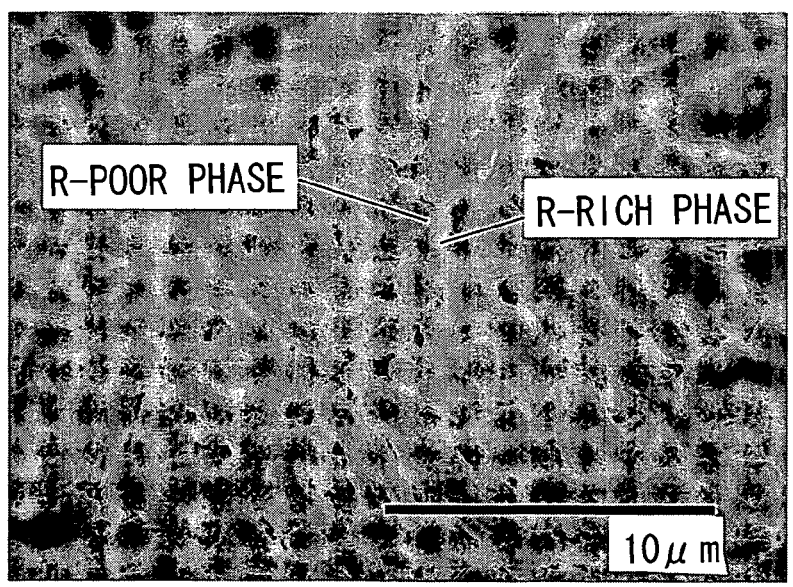
FIG. 2 shows a back-scattered electron image of a cross-section of a sample of La(Fe$_{0.89}$Si$_{0.11}$)$_{13}$ alloy produced through strip casting.

FIG. 2 is a back-scattered electron image of a cross-section of a sample of $La(Fe_{0.89}Si_{0.11})_{13}$ alloy, which is an example of an alloy having a composition of $R_rT_tA_a$ cast through the above rapid quenching method. In a back-scattered electron image of the alloy, a portion having a large average atomic weight is observed as a white image, whereas a portion having a small average atomic weight is observed as a black image. Thus, the R-rich phase, having a high rare earth metal content, is observed as a white image, and the R-poor phase, having a rare earth metal content lower than that of the R-rich phase, is observed as a gray image. As shown in FIG. 2, the alloy produced through the aforementioned rapid quenching method is formed of an R-rich phase, having a relatively high rare earth metal content, and an R-poor phase, having a relatively low rare earth metal content. The back-scattered electron image of FIG. 2 indicates that the R-rich phase (white image) has a size of 5 μm or less, that the R-poor phase (gray image) has a diameter of 10 μm or less, and that the phases are uniformly distributed in the microstructure.

In the microstructure of the cast RE-containing alloy, each of the R-rich phase and R-poor phase has a size (diameter) of 30 μm or less, preferably 10 μm or less. Preferably, both phases are uniformly dispersed in the structure. When an RE-containing alloy has such a microstructure, the diffusion path of elements between the R-rich phase and the R-poor phase is shortened. Thus, α-Fe can be dispersed minutely and uniformly through heat treatment carried out for a short period of time. As a result, an RE-containing alloy containing an $NaZn_{13}$-type crystal structure in an amount of 85 mass % or more can be readily produced through heat treatment carried out for a short period of time. An RE-containing alloy containing an R-rich phase and an R-poor phase each having a size (diameter) of 30 μm or less can be reliably produced by casting through rapid quenching at a cooling rate of $10^2$ to $10^{4\circ}$ C./second, as measured within a range of the temperature of the molten alloy to 900° C.

Figure 3:
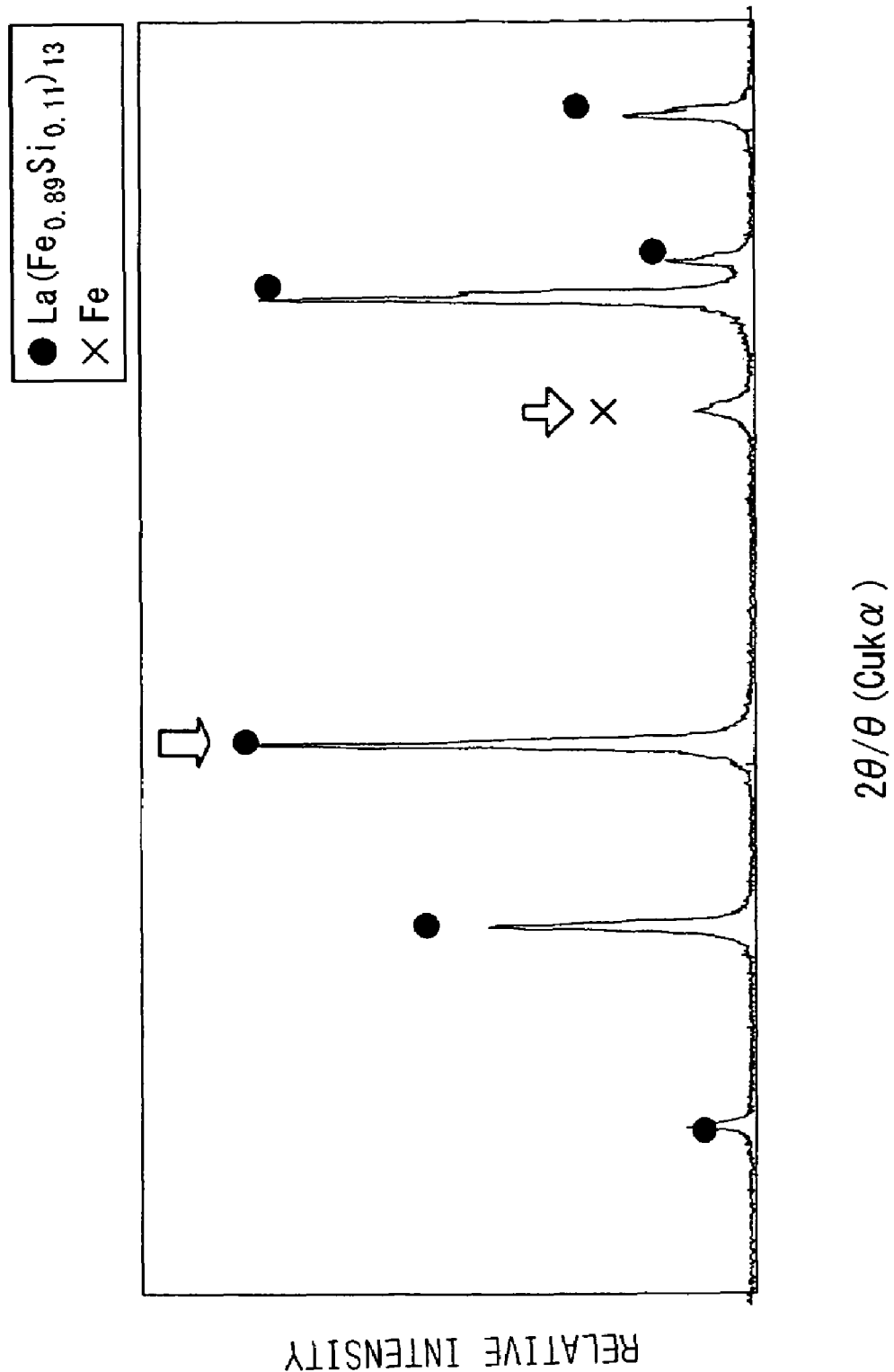
FIG. 3 is an X-ray diffraction chart of an alloy powder which has been produced through rapid quenching based on strip casting, followed by heat treatment at 1,100° C. for 12 hours.

Through heat treatment of an alloy which has been cast through the above rapid quenching method (i.e., RE-containing alloy which has not yet undergone heat treatment), the amount of the $NaZn_{13}$ structure contained in the alloy microstructure can be increased to 85 mass % or more. FIG. 3 is an X-ray diffraction chart of an alloy powder which has been produced by casting the alloy through strip casting, followed by heat treatment at 1,100° C. for 12 hours. Notably, the alloy shown in FIG. 3 has been produced from La, Fe, and Si serving as raw materials of components R, T, and A, respectively. The compositional proportions (at. %) are as follows: r=6.8%; t=82.9%; and a=10.3%.

The amount of $NaZn_{13}$-structure $La(Fe_{0.89}Si_{0.11})_{13}$ formed in the RE-containing alloy shown in FIG. 3 can be calculated in a simple manner. Specifically, the intensity of the maximum peak attributed to $La(Fe_{0.89}Si_{0.11})_{13}$ in powder X-ray diffractiometry is determined; the intensities of the maximum peaks attributed to the phases other than $La(Fe_{0.89}Si_{0.11})_{13}$ are determined; and the intensity for $La(Fe_{0.89}Si_{0.11})_{13}$ is divided by the sum of the intensity for $La(Fe_{0.89}Si_{0.11})_{13}$ and the intensities for the other phases.

For example, as indicated by the arrows shown in FIG. 3, the maximum peak attributed to $La(Fe_{0.89}Si_{0.11})_{13}$ is observed at approximately 38.4° through measurement by use of a CuKα ray, whereas the maximum peak attributed to α-Fe (a phase other than $La(Fe_{0.89}Si_{0.11})_{13}$) is observed at 44.7°. Thus, the amount of formed $La(Fe_{0.89}Si_{0.11})_{13}$ can be calculated from the following formula: 100×(the peak intensity at 38.4°)/(the peak intensity at 38.4°+the peak intensity at 44.7°) (%). The calculation requires a calibration curve indicating the relationship between the intensity ratio and the phase ratio. According to the above calculation method on the basis of the chart of FIG. 3 and the calibration curve, the amount of $La(Fe_{0.89}Si_{0.11})_{13}$ formed was calculated to be 92 mass % and that of α-Fe formed was calculated to be 8 mass %.

These results are consistent with the features of the back-scattered image. Specifically, in the back-scattered electron image of FIG. 2 showing the microstructure of the RE-containing alloy which has not yet undergone heat treatment, an R-rich phase and an R-poor phase each having a small size are observed. However, the back-scattered electron image of FIG. 4 showing the microstructure of the RE-containing alloy which has undergone heat treatment indicates that the structure is formed of $La(Fe_{0.89}Si_{0.11})_{13}$ and a small amount of α-Fe.

Figure 4:
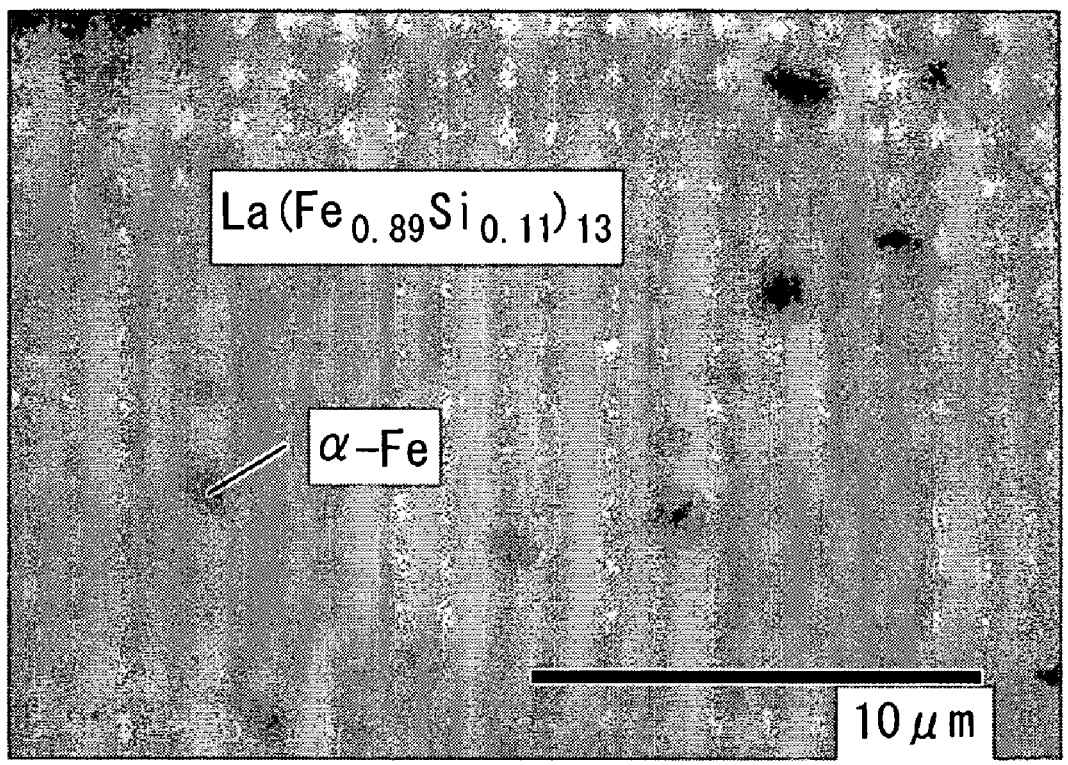
FIG. 4 shows a back-scattered electron image of a cross-section of an alloy sample which has been treated at 1,100° C. for 12 hours.

As is clear from FIGS. 2 to 4, in the alloy according to the present invention which has been cast through rapid quenching, the R-rich phase and R-poor phase tend to be transformed through heat treatment to $NaZn_{13}$-structure $La(Fe_{0.89}Si_{0.11})_{13}$, and the amount thereof can be readily elevated to 85 mass % or more.

The temperature for treating the RE-containing alloy which has been cast through the aforementioned method preferably falls within a range of 1,080° C. to 1,200° C. For example, when the RE-containing alloy is heat-treated in vacuum at a temperature increase rate of 10 K/minute and a retention time at a maximum heating temperature of one hour, the R-rich phase and the R-poor phase contained in the alloy are removed, and $La(Fe_{0.89}Si_{0.11})_{13}$ content increases through heating of the alloy at 1,080° C. to 1,200° C. The $La(Fe_{0.89}Si_{0.11})_{13}$ content exceeds 85 mass %.

However, when the alloy is heat-treated at a temperature higher than 1,200° C., rare earth metal elements present on the surface of an alloy piece are evaporated, resulting in rare earth component deficiency. The deficiency induces decomposition of the $NaZn_{13}$ phase. In addition, the size of α-Fe remaining in the alloy increases, thereby affecting pulverization performance of the alloy for producing fine powder. Therefore, a heat treatment temperature higher than 1,200° C. is not preferred. When the heat treatment temperature is lower than 1,080° C., the amount of the $NaZn_{13}$ phase formed fails to reach 85%, and in addition to α-Fe, La and lamellar-form Fe tend to remain in the alloy, which is not preferred.

Figure 5:
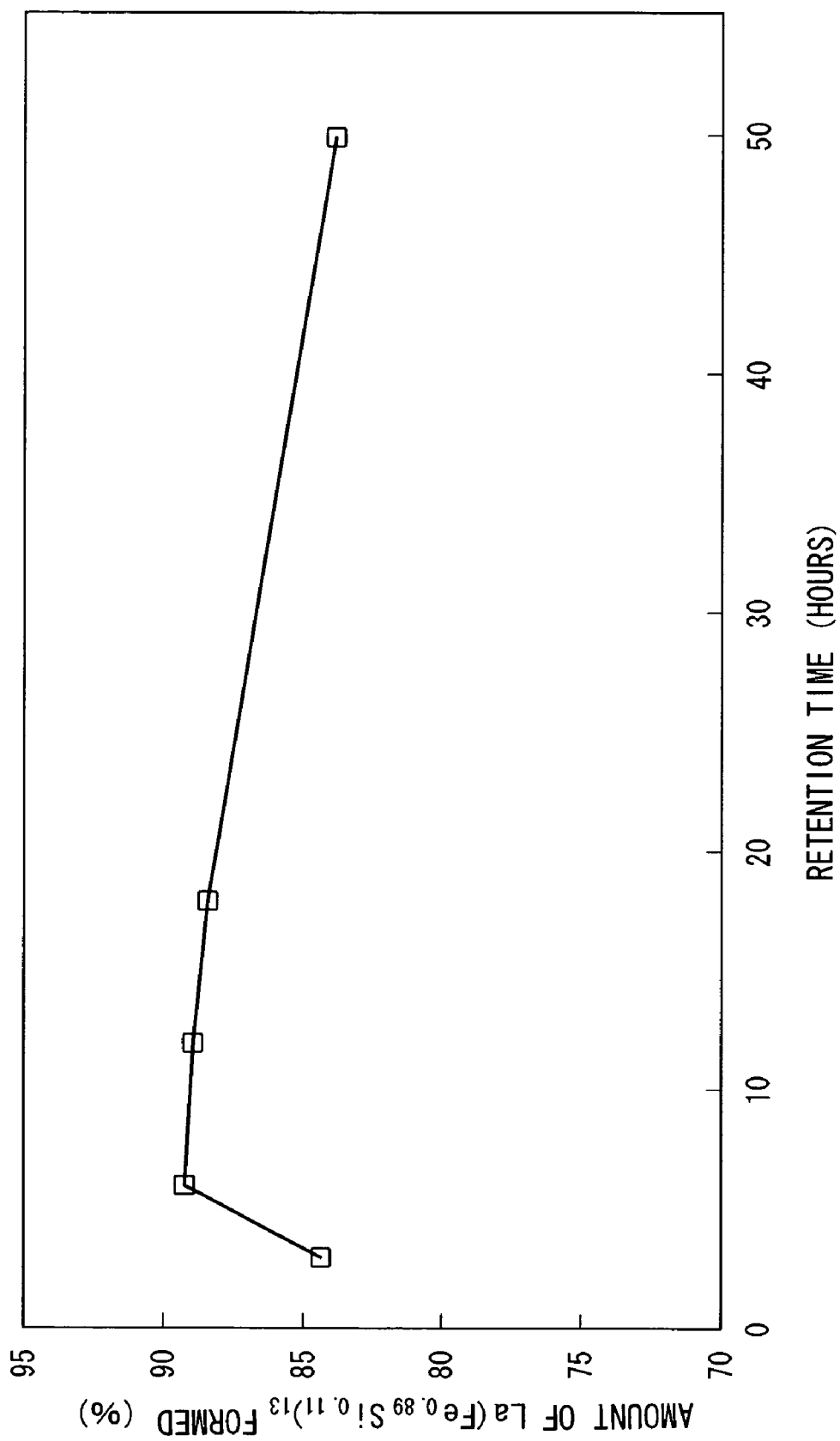
FIG. 5 is a graph showing the relationship between the amount of La(Fe$_{0.89}$Si$_{0.11}$)$_{13}$ formed and the time for heat-treating at 1,100° C.
Figure 6:
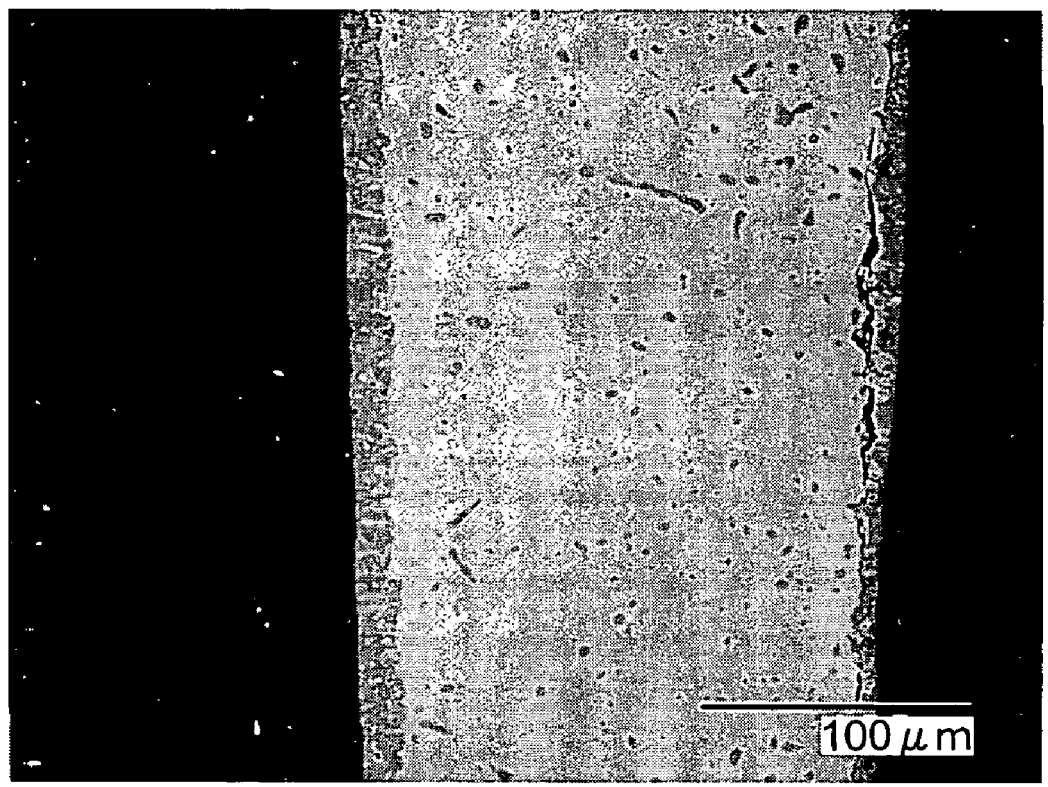
FIG. 6 shows a back-scattered electron image of a cross-section of an alloy sample which has been treated at 1,100° C. for 200 hours.

FIG. 5 is a graph showing the relationship between the amount of $La(Fe_{0.89}Si_{0.11})_{13}$ formed and the retention time for heat-treating an RE-containing alloy at a maximum retention temperature of 1,100° C. As is clear from FIG. 5, in the case where the alloy is maintained at 1,100° C., the amount of $La(Fe_{0.89}Si_{0.11})_{13}$ formed gradually decreases when the heat treatment time exceeds 12 hours. A conceivable reason for the decrease is that a rare earth element component present in the near surface of the alloy piece is released and evaporated to yield an alloy microstructure as shown in FIG. 6, which should have desirably yielded a uniform microstructure as shown in FIG. 4. Formation of a defect resulting from the mentioned release or evaporation is not preferred, since pulverization characteristics are affected. According to the findings from FIGS. 4 and 5, the heat treatment is preferably performed at 1,080 to 1,200° C. for 3 to 42 hours. More preferably, the heat treatment is performed at a maximum heat treatment temperature of 1,100 to 1,120° C. and a retention time of 6 to 12 hours.

The RE-containing alloy which has been cast through rapid quenching and has undergone heat treatment (the third RE-containing alloy) assumes the form of flakes, which themselves are not suited for producing a magnetic refrigerant or a magnetostrictive material. Therefore, the flakes are pulverized to form a powder having a mean particle size of 0.1 μm to 1.0 mm. The powder itself or a sintered product obtained by compacting and sintering the powder is employed as a magnetic refrigerant or a mangetostrictive material. For example, a powder having a particle size of at least 200 μm is preferably employed as a magnetic refrigerant without further treatment, whereas a powder having a particle size less than 200 μm is preferably sintered to provide a magnetostrictive device or a magnetic refrigerant.

The aforementioned third RE-containing alloy can be pulverized by various mechanical means in accordance with the target mean particle size of the powder; e.g., a jaw crusher (500 μm or more); a disk mill (50 to 500 μm); and an attriter or ajet mill employing an inert gas such as nitrogen or argon (50 μm or less). The produced powder is sieved in accordance with need, to thereby form a powder having a desired particle size. When a jet mill is employed, the shape of the powder can be regulated by controlling the amount of alloy placed in a container of a pulverizer and the pressure of pulverization gas.

When the amount (as determined through powder X-ray diffractometry) of the $NaZn_{13}$ structure formed in the aforementioned third RE-containing alloy is less than 85 mass % and α-Fe content (as determined through powder X-ray diffractometry) is more than 15 mass %, ease of pulverization of the alloy by mechanical means is considerably deteriorated, whereas when the amount of the $NaZn_{13}$ structure formed in the alloy is 85 mass % or more, such an alloy is brittle and readily pulverized. Thus, when the third RE-containing alloy is mechanically pulverized, the amount of the $NaZn_{13}$ structure formed in the alloy and the α-Fe content must be controlled to 85 mass % or more and 15 mass % or less, respectively.

The amount of the $NaZn_{13}$ structure formed in the third RE-containing alloy and the α-Fe content can be controlled by modifying the composition of the alloy and the cast alloy heating conditions. In order to control the amount of the $NaZn_{13}$ structure formed in the RE-containing alloy to 85 mass % or more and control the α-Fe content to 15 mass % or less, an RE-containing alloy is cast through rapid quenching, followed by further heat treatment at 1,080° C. to 1,200° C. for 3 to 42 hours, the RE-containing alloy being represented by a compositional formula of $R_r T_t A_a$ (wherein R represents at least one rare earth element selected from among La, Ce, Pr, Nd, Sm, Eu, Th, Dy, Ho, Tm, Yb, Gd, and Lu; T collectively represents transition metal elements containing at least Fe atoms, a portion of the Fe atoms being optionally substituted by at least one species selected from among Co, Ni, Mn, Pt, and Pd; A represents at least one element selected from among Al, As, Si, Ga, Ge, Mn, Sn, and Sb; and r, t, and a have the following relationships: 5.0 at. % ≦ r ≦ 6.8 at. %, 73.8 at. % ≦ t ≦ 88.7 at. %, and 4.6 at. % ≦ a ≦ 19.4 at. %).

In the case in which the RE-containing alloy powder is used without performing further treatment, the mechanical strength of the alloy powder is enhanced by maintaining the amount of α-Fe contained in particles of the powder at 5 mass % or more, thereby preventing crushing of the powder. As a result, when the powder is employed as, for example, a magnetic refrigerant, clogging of a filter is prevented, thereby enhancing operational reliability. Therefore, the third RE-containing alloy powder preferably contains α-Fe in an amount of 5-15 mass % inclusive.

In the case in which the third RE-containing alloy powder is compacted, a compact having sufficient mechanical strength is produced at a compacting pressure of 0.8 t/cm² or higher. Such a compact can be used without any problem in a subsequent step, such as conveying. However, when the alloy powder is compacted at a pressure lower than 0.8 t/cm², the produced compact has poor mechanical strength and is difficult to use, because of chipping.

Figure 7:
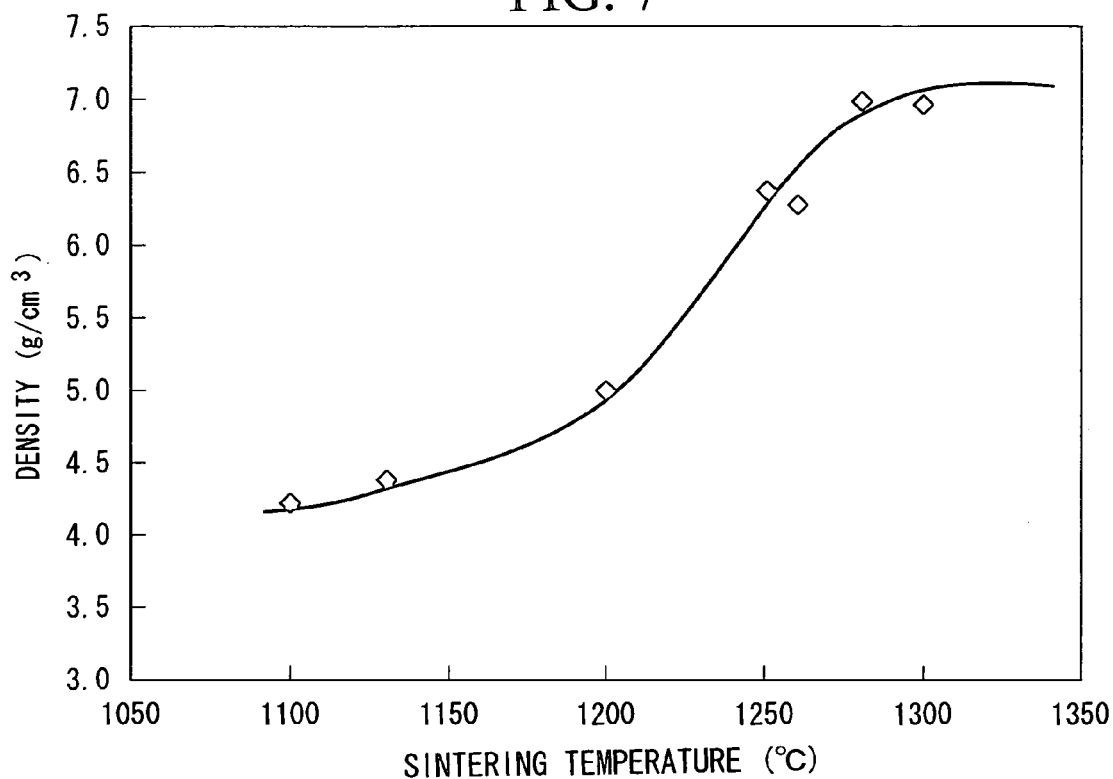
FIG. 7 is a graph showing the relationship between the sintering temperature and the sintered product density.

When the compact is sintered in a vacuum or an inert gas atmosphere at 1,200 to 1,400° C., preferably 1,280 to 1,300° C., a high-density RE-containing alloy sintered product can be produced. FIG. 7 is a graph showing the relationship between sintering temperature and density of the sintered product, the product having been obtained from an alloy powder having a particle size of 50 to 100 μm. As is clear from FIG. 7, sintering at 1,280° C. or more results in sufficient density of the sintered product. For example, a compact produced from $La(Fe_{0.89}Si_{0.11})_{13}$ powder (particle size: 50 to 100 μm) is sintered at 1,280° C. for three hours, followed by heating at 1,100° C. for 12 hours, to thereby produce sintered $La(Fe_{0.89}Si_{0.11})_{13}$ having a density of 6.9 g/cm³ or more.

Figure 8:
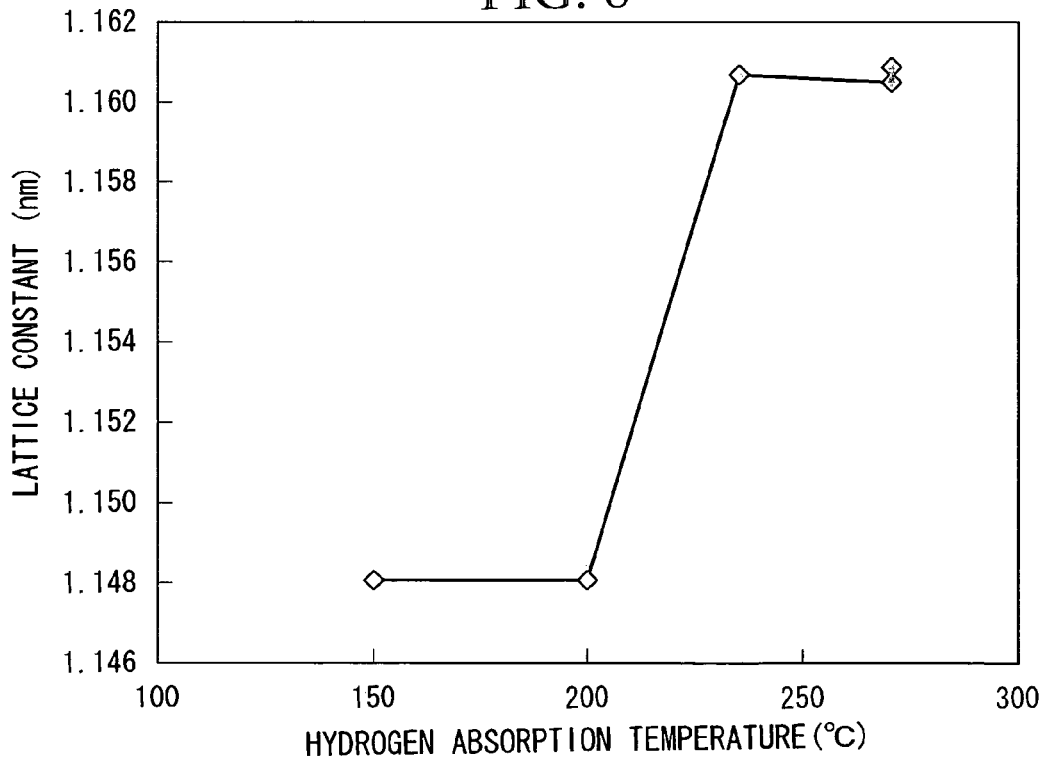
FIG. 8 is a graph showing the relationship between the temperature for hydrogen-treating of sintered La(Fe$_{0.89}$Si$_{0.11}$)$_{13}$ (absorption temperature) and the lattice constant of the sintered product.

The Curie temperature of the sintered RE-containing alloy can be controlled by absorbing hydrogen into the sintered alloy. FIG. 8 is a graph showing the relationship between the absorption temperature and the lattice constant of the sintered RE-containing alloy which has absorbed hydrogen. As shown in FIG. 8, no change in lattice constant is observed from room temperature to 200° C., indicating that hydrogen absorption does not occur. At 200° C. and higher, an increase in lattice constant induced by hydrogen absorption is observed. Accordingly, in order to absorb hydrogen into the sintered alloy, the sintered alloy is preferably maintained in hydrogen at atmospheric pressure for one hour or longer at a maximum temperature of 200 to 300° C., more preferably 230 to 270° C., and cooled in the hydrogen atmosphere. Thus, absorbing hydrogen into the sintered alloy changes the lattice constant, thereby controlling the Curie temperature of the sintered RE-containing alloy.

Figure 9:
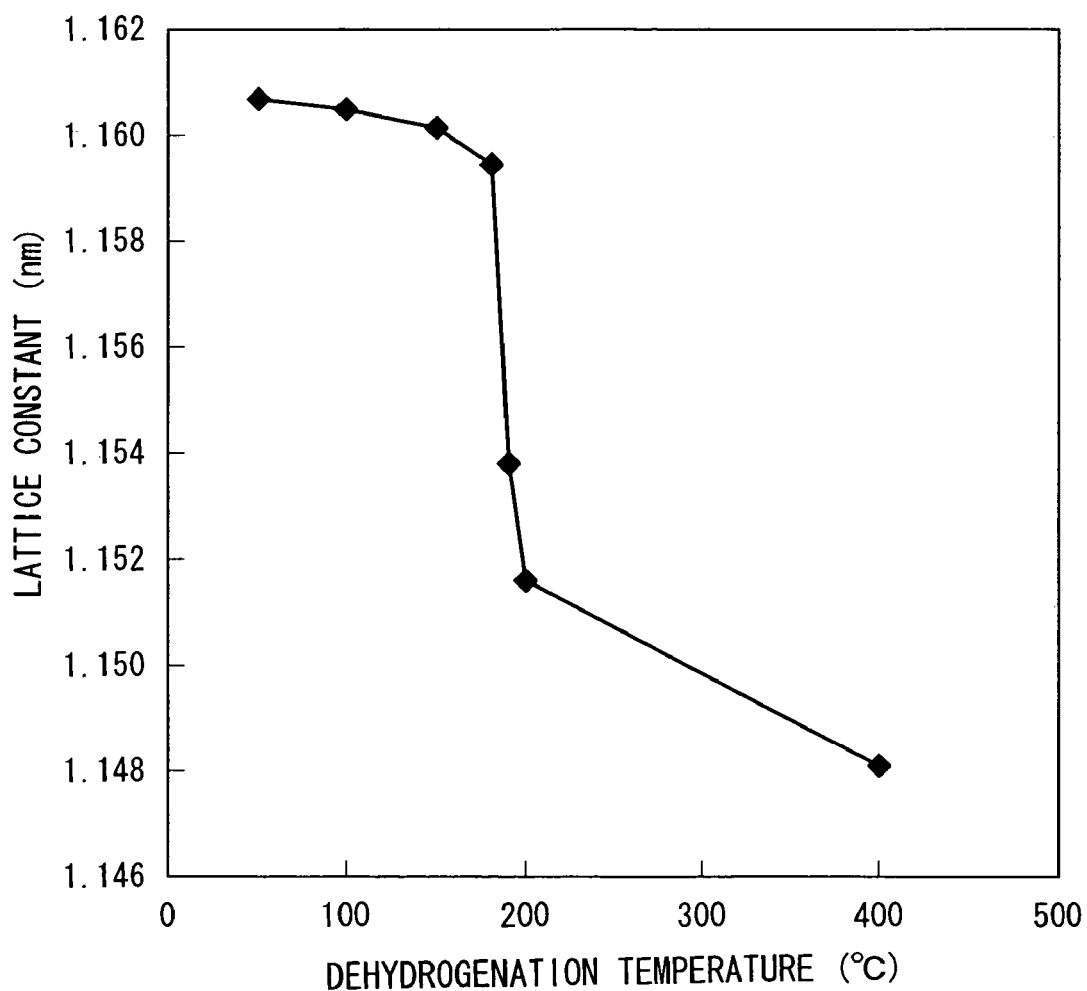
FIG. 9 is a graph showing the relationship between the dehydrogenation temperature and the lattice constant of La(Fe$_{0.89}$Si$_{0.11}$)$_{13}$.

After completion of hydrogen absorption, excessive hydrogen absorbed in the sintered alloy can be released by heating the sintered alloy at 100 to 200° C. under Ar or in vacuum. FIG. 9 is a graph showing change in lattice constant of a sintered alloy which has undergone excessive hydrogen absorption by heating at 400° C. in hydrogen at atmospheric pressure, followed by dehydrogenation at various temperatures. As is clear from FIG. 9, the lattice constant decreases as the dehydrogenation temperature is elevated. In particular, decrease in lattice constant is remarkable from about 190° C.

When hydrogen is absorbed into a sintered RE-containing alloy having an α-Fe content less than 5 mass %, numerous cracks are induced by hydrogen absorption in the sintered alloy, leading to deterioration of mechanical strength, which is not preferred. Therefore, in the case where the Curie temperature of a sintered RE-containing alloy is controlled through hydrogen absorption, the RE-containing alloy preferably contains α-Fe in the alloy microstructure in an amount of at least 5 mass % so as to maintain mechanical strength of the sintered alloy. In other words, in order to satisfy both pulverization efficiency and mechanical strength of the sintered alloy, the RE-containing alloy preferably contains α-Fe in an amount of 5-15 mass % inclusive.

The RE-containing alloy may further contain, other than the NaZn$_{13}$ structure and α-Fe, a second phase in the microstructure. The second phase is provided for exerting an effect for enhancing thermal conversion efficiency by increasing the width of a peak attributed to entropy change.

According to the method for producing a sintered RE-containing alloy of the present invention, a plurality of long-term heat treatments, which have conventionally been performed, can be omitted, thereby reducing the oxygen concentration. Specifically, a sintered alloy having an oxygen concentration of 5,000 ppm or less can be produced.

The sintered RE-containing alloy produced according to the present invention is corroded when exposed to the air or to a wet atmosphere. Therefore, in accordance with needs, progress of corrosion can be prevented by coating with resin or metal. Through coating, the oxygen concentration and the nitrogen concentration in the sintered alloy can be suppressed to 5,000 ppm or less.

According to the present invention, the oxygen concentration of alloy powder, sintered alloy, and compacts can be suppressed to a low level. Thus, even when rare earth metals serving as starting materials have a purity of about 98 mass %, satisfactory characteristics can be attained.

When the RE-containing alloy powder of the present invention is employed as a magnetic refrigerant, absorption of hydrogen into the RE-containing alloy before pulverization provides the following two points: magnetic phase transfer temperature can be satisfactorily controlled, and ease of pulverization can be enhanced.

The sintered RE-containing alloy produced according to the present invention can be employed as a magnetostrictive material for producing a magnetostrictive device. Specifically, the device is produced by winding a coil around the sintered alloy product and works by changing a magnetic field to cause dimensional changes of the sintered alloy product. When the alloy is employed as a magnetic refrigerant, the alloy is charged, in the form of a plate, porous sintered product, or powder, into a tube through which a cooling medium is passed.

EXAMPLES

The present invention will next be described by way of an Example and a Comparative Example.

Example 1

Metallic La (serving as a source of rare earth metal (R)), electrolytic iron (serving as a source of transition metal (T)), and metallic Si (serving as a source of element (A)) were weighed and mixed such that an alloy composition of La(Fe$_{0.88}$Si$_{0.12}$)$_{13}$ was attained. The mixture was melted in an Ar atmosphere at 0.1 MPa, by means of heating to 1,600° C.

Subsequently, by means of a strip casting apparatus shown in FIG. 1, the molten metal was poured, onto a copper roller which was cooled with water and rotating at a rotating speed of 0.882 m/s, at a pour rate of 150 g/s and a width of 85 mm, to thereby rapidly quench the molten metal, whereby alloy strips having a thickness of 0.28 mm were produced. The cooling rate as measured within a range of 1,600 to 900° C. was found to be approximately 1×10$^3$ ° C./sec.

Figure 10:
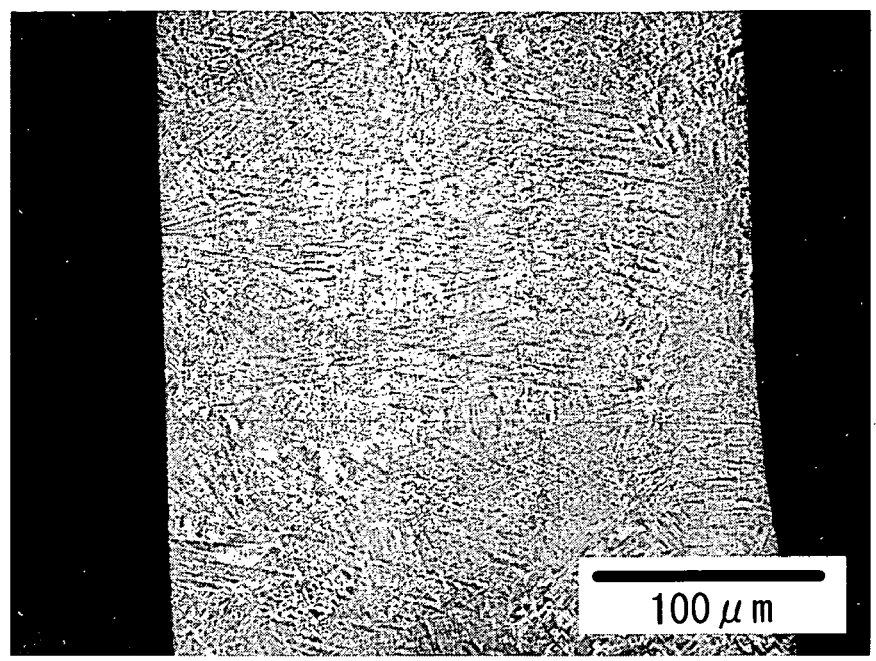
FIG. 10 is a back-scattered electron image of an RE-containing alloy sample produced in the Example of the present invention.
Figure 11:
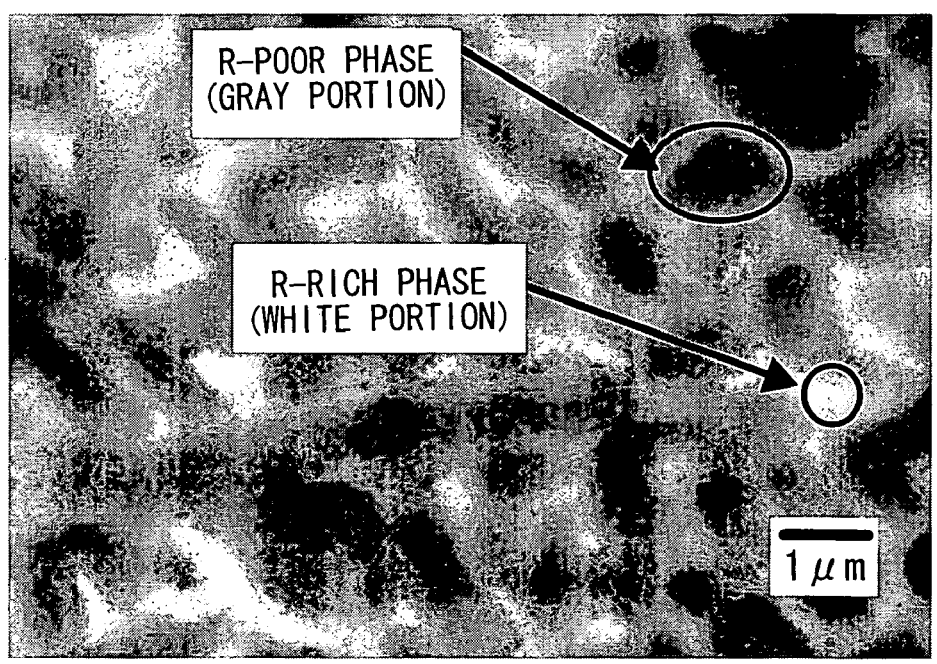
FIG. 11 is a back-scattered electron image of an RE-containing alloy sample produced in the Example of the present invention.

FIGS. 10 and 11 are back-scattered electron images of a cross-section of a sample of the produced alloy strips. The image of FIG. 11 is an enlarged image of FIG. 10.

As shown in the FIGs., the alloy strip sample was found to have a minute microstructure in which an R-rich phase (white portion) had a size of 5 μm or less and an R-poor phase (gray portion) had a size of 10 μm or less.

The thus-produced alloy strips were heated at 1,100° C. for three hours in a vacuum atmosphere (≦5 Pa), followed by pulverization. The formed powder was analyzed through powder X-ray diffractometry. Through analysis, a peak attributed to NaZn$_{13}$ structure (containing rare earth metals) was observed, confirming that an NaZn$_{13}$ phase was formed. Through observation of a back-scattered electron image, the NaZn$_{13}$ phase content was found to be 90 vol. % or higher.

According to the present invention, a starting alloy in which an R-rich phase and an R-poor phase are uniformly dispersed at a phase spacing of 0.01 to 100 μm can be produced. From the starting alloy, an NaZn$_{13}$-type RE-containing alloy having an NaZn$_{13}$ phase content of at least 90 vol. % can be produced through heat treatment for a time as short as one minute to 200 hours.

Comparative Example 1

A molten metal was prepared in a manner similar to that of the Example, and an alloy was produced through the book mold method. Specifically, the molten metal was poured into a mold in which copper plates having a thickness of 20 mm were juxtaposed at intervals of 30 mm, and allowed to stand for three hours for cooling to 50° C.

Figure 12:
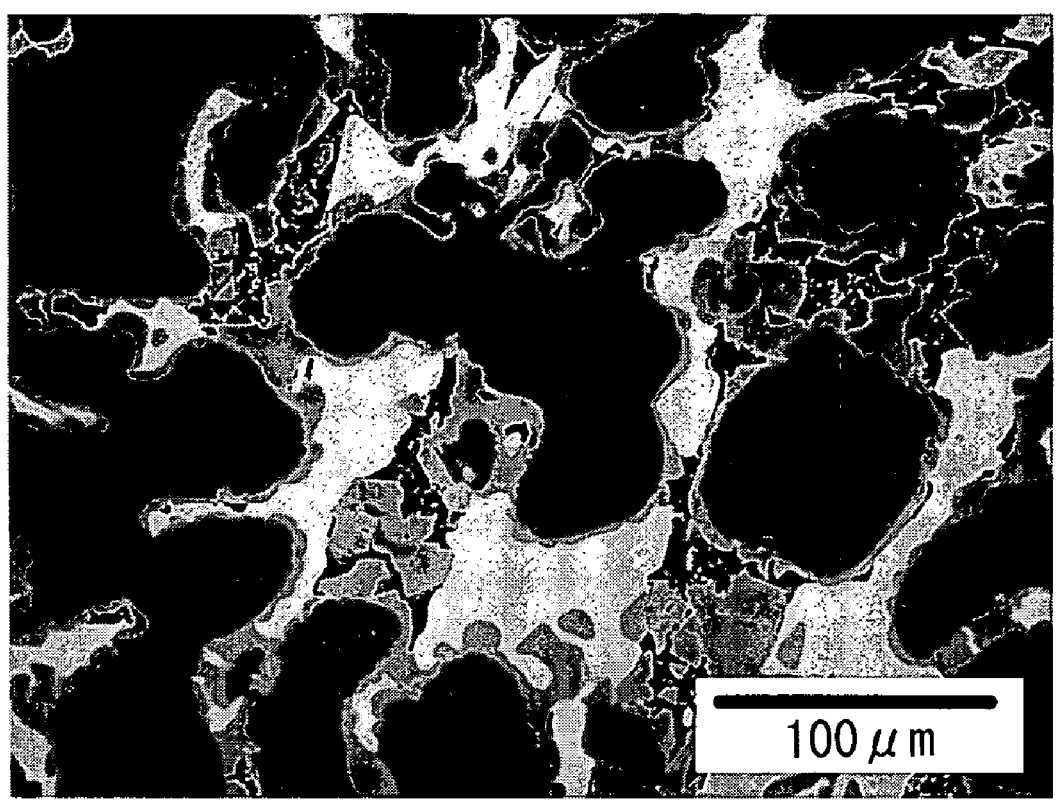
FIG. 12 is a back-scattered electron image of an RE-containing alloy sample produced in the Comparative Example of the present invention.

FIG. 12 is a back-scattered image of a cross-section of the produced alloy sample.

As is clear from comparison of FIGS. 10 and 12, the alloy of the Comparative Example 1 produced through the book mold method has a considerably coarse alloy microstructure as compared with that of the alloy of Example 1 produced through rapid quenching. In addition, the alloy of the Comparative Example includes three or more phases; i.e., an R-rich phase, an R-poor phase, and one or more other phases, with each phase having a size of 100 μm or more.

The alloy was heated at 1,100° C. for three hours, followed by pulverization. The formed powder was analyzed through powder X-ray diffractometry. Through analysis, in addition to a peak attributed to NaZn$_{13}$ structure, peaks attributed to α-Fe and an undesired phase were observed. Through observation of a back-scattered electron image of the alloy for analysis of metallographic microstructure and formed phases, the alloy was found to be formed of multiphases, and the undesired phase was found to remain after heat treatment of 1,100° C. for 100 hours. The results indicate that removing the undesired phase present in the alloy requires a long-period heat treatment.

Example 2

Metallic La (purity: ≧98 mass %) (6.5 at. %), pure iron (purity: ≧99 mass %) (83.2 at. %), and metallic Si (purity: ≧99.99 mass %) (10.3 at. %) were melted under Ar, and the molten alloy was cast through strip casting, to thereby produce alloy strips having a thickness of 0.25 mm. Subsequently, the thus-cast La—Fe—Si alloy was heated in a vacuum at 1,100° C. for 12 hours.

The thus-produced La—Fe—Si alloy was pulverized by means of a disk mill, and the formed powder was classified by use of a sieve (100 μm). The pulverization efficiency was found to be 1.2 kg/h. Subsequently, the thus-produced powder was compacted in a nitrogen atmosphere at a compacting pressure of 1.0 t/cm$^2$. The compact was sintered in a vacuum at 1,280° C. for three hours, followed by heating at 1,100° C. for 12 hours, to thereby produce sintered La(Fe$_{0.89}$Si$_{0.11}$)$_{13}$ alloy.

X-ray diffractometry of the sintered alloy shows that the relative peak intensity of $La(Fe_{0.89}Si_{0.11})_{13}$ alloy, having $NaZn_{13}$-type crystal structure, is 93 mass %. Regarding a phase other than $La(Fe_{0.89}Si_{0.11})_{13}$ alloy, a peak attributed to α-Fe (7 mass %) was observed.

When the sintered alloy was maintained in hydrogen at atmospheric pressure at 270° C. for one hour, an increase (0.9%) in lattice constant was identified through powder X-ray diffractometry, indicating that hydrogen was absorbed in the alloy. Cracking caused by an increase in volume was not observed.

The oxygen concentration and the nitrogen concentration of the sintered alloy were determined to be 2,250 ppm and 80 ppm, respectively.

Comparative Example 2

Metallic La (purity: ≧98 mass %) (6.5 at. %), pure iron (purity: ≧99 mass %) (83.2 at. %), and metallic Si (purity: ≧99.99 mass %) (10.3 at. %) were melted under Ar, and the thus-produced La—Fe—Si alloy was cast by pouring into a mold in which copper plates were juxtaposed at intervals of 30 mm. The cooling rate at the casting, as measured within a range of the temperature of the molten alloy to 900° C., was less than 100° C./second.

The thus-obtained alloy was heated at 1,100° C. for 12 hours. The heated alloy was found to contain α-Fe in an amount of 46 mass % and $La(Fe_{0.89}Si_{0.11})_{13}$, having an $NaZn_{13}$ structure, in an amount of 54 mass %. The thus-produced alloy was pulverized by means of a disk mill, and the formed powder was classified by use of a sieve (100 μm). Since the alloy has an α-Fe content in excess of 15 mass %, the pulverization efficiency did not reach 0.2 kg/h. Subsequently, the thus-produced powder was compacted in a nitrogen atmosphere at compacting pressure of 1.0 t/cm². The compact was sintered in vacuum at 1,280° C. for three hours, followed by maintaining at 1,100° C. for 12 hours, to thereby produce sintered $La(Fe_{0.89}Si_{0.11})_{13}$.

When the sintered alloy was maintained in hydrogen at atmospheric pressure at 270° C. for one hour, an increase (0.9%) in lattice constant was identified through powder X-ray diffractometry, indicating that hydrogen was absorbed in the alloy. Cracking of the sintered alloy caused by increase in volume was not observed.

The oxygen concentration and the nitrogen concentration of the sintered product were determined to be 6,200 ppm and 130 ppm, respectively.

The percent volume increase in a magnetic field of a device produced from the alloy was found to be 40% or less based on that of a device produced from the alloy of the Example.

Comparative Example 3

Metallic La (purity: ≧98 mass %) (7.0 at. %), pure iron (purity: ≧99 mass %) (82.7 at. %), and metallic Si (purity: ≧99.99 mass %) (10.3 at. %) were melted under Ar, and the molten alloy was cast through strip casting, to thereby produce alloy strips having a thickness of 0.25 mm. Subsequently, the thus-cast La—Fe—Si alloy was heated in a vacuum at 1,100° C. for 12 hours. The thus-produced alloy was pulverized by means of a disk mill, and the formed powder was classified by use of a sieve (100 μm). The pulverization efficiency was found to be 1.3 kg/h. Subsequently, the thus-produced powder was compacted in a nitrogen atmosphere at compacting pressure of 1.0 t/cm². The compact was sintered in vacuum at 1,280° C. for three hours, followed by maintaining at 1,100° C. for 12 hours, to thereby produce sintered $La(Fe_{0.89}Si_{0.11})_{13}$.

The sintered product was found to have an $La(Fe_{0.89}Si_{0.11})_{13}$ content, as measured from the relative peak intensity of $La(Fe_{0.89}Si_{0.11})_{13}$, of 99 mass %. Regarding a phase other than $La(Fe_{0.89}Si_{0.11})_{13}$, 1 mass % of α-Fe was determined from the peak intensity of α-Fe.

When the sintered product was maintained in hydrogen at atmospheric pressure at 270° C. for one hour, an increase (0.9%) in lattice constant was identified through powder X-ray diffractometry, indicating that hydrogen was absorbed in the product. The sintered product of the solid form was cracked through absorption of hydrogen, to thereby form its powder products.

INDUSTRIAL APPLICABILITY

The RE-containing alloy according to the present invention can be utilized to produce a magnetstrictive device and a magnetic refrigerant, and thus has industrial applicability.

The invention claimed is:

1. A method for producing an RE-containing alloy represented by formula $R(T_{1-x}A_x)_{13-y}$ (wherein R represents at least one species selected from among La, Ce, Pr, Nd, Sm, Eu, Tb, Dy, Ho, Tm, Yb, Gd, and Lu; T represents at least one species selected from among Fe, Co, Ni, Mn, Pt, and Pd; and A represents at least one species selected from among Al, As, Si, Ga, Ge, Mn, Sn, and Sb ($0.05 \leq x \leq 0.2$; and $-1 \leq y \leq 1$)) comprising:

a melting step of melting alloy raw materials at 1,200 to 1,800° C.; and a solidification step of solidifying the molten metal produced through the above melting step by rapidly quenching the molten metal, to thereby form the RE-containing alloy, wherein the solidifying is performed at a cooling rate of $10^2$ to $10^{4o}$ C./second, as measured at least within a range of the temperature of the molten metal to 900° C., and wherein in the solidification step, the molten metal is rapid-quenched through any of strip casting, centrifugal casting with a tundish having a rotatable disk, and centrifugal casting.

2. A method for producing the RE-containing alloy according to claim 1, wherein the solidifying is performed by rapidly quenching the molten metal through strip casting, to obtain strips having a thickness of 0.1 to 2.0 mm.

3. A method for producing an RE-containing alloy represented by formula $R(T_{1-x}A_x)_{13-y}$ (wherein R represents at least one species selected from among La, Ce, Pr, Nd, Sm, Eu, Tb, Dy, Ho, Tm, Yb, Gd, and Lu; T represents at least one species selected from among Fe, Co, Ni, Mn, Pt, and Pd; and A represents at least one species selected from among Al, As, Si, Ga, Ge, Mn, Sn, and Sb ($0.05 \leq x 0.2$; and $-1 \leq y \leq 1$)) comprising:

melting alloy raw materials at 1,200 to 1,800° C.;

solidifying the molten metal produced through the above melting step by rapidly quenching the molten metal, to thereby form an RE-containing alloy, wherein the solidifying is performed at a cooling rate of $10^2$ to $10^{4o}$ C./second, as measured at least within a range of the temperature of the molten metal to 900° C., and heat treating by heating at 900 to 1,200° C. the RE-containing alloy that is produced through the solidifying, to thereby form an $NaZn_{13}$ phase.

4. The method for producing an RE-containing alloy according to claim 3, wherein the $NaZn_{13}$ phase is formed through the heat treating, which is performed for a period of from one minute to 200 hours.

5. An RE-containing alloy which is obtainable through the method of any one of claims 1 to 2.

6. An RE-containing alloy, which is represented by the formula $R(T_{1-x}A_x)_{13-y}$ (wherein R represents at least one species selected from among La, Ce, Pr, Nd, Sm, Eu, Tb, Dy, Ho, Tm, Yb, Gd, and Lu; T represents at least one species selected from among Fe, Co, Ni, Mn, Pt, and Pd; and A represents at least one species selected from among Al, As, Si, Ga, Ge, Mn, Sn, and Sb ($0.05 \leq x \leq 0.2$; and $-1 \leq y \leq 1$)), and which comprises an R-rich phase, having a relatively high rare earth metal (R) content, and an R-poor phase, having a relatively low rare earth metal (R) content, wherein the R-rich phase and the R-poor phase are dispersed at a phase spacing of 0.01 to 100 μm.

7. An RE-containing alloy, which is represented by the formula $R(T_{1-x}A_x)_{13-y}$ (wherein R represents at least one species selected from among La, Ce, Pr, Nd, Sm, Eu, Tb, Dy, Ho, Tm, Yb, Gd, and Lu; T represents at least one species selected from among Fe, Co, Ni, Mn, Pt, and Pd; and A represents at least one species selected from among Al, As, Si, Ga, Ge, Mn, Sn, and Sb ($0.05 \leq x \leq 0.2$; and $-1 \leq y \leq 1$)), wherein the alloy has an $NaZn_{13}$ phase content of at least 90 vol. %.

8. A magnetostrictive device provided from the RE-containing alloy according to claim 7.

9. A magnetic refrigerant provided from the RE-containing alloy according to claim 7.

10. The method for producing an RE-containing alloy according to claim 1, wherein, in the melting step, the alloy raw material is melted in an inert gas atmosphere at 0.1 to 0.2 MPa.

* * * * *

UNITED STATES PATENT AND TRADEMARK OFFICE
CERTIFICATE OF CORRECTION

| | |
|---|---|
| PATENT NO. | : 7,695,574 B2 |
| APPLICATION NO. | : 10/531480 |
| DATED | : April 13, 2010 |
| INVENTOR(S) | : Kenichiro Nakajima |

It is certified that error appears in the above-identified patent and that said Letters Patent is hereby corrected as shown below:

Title Pg, Item (73) should read -- <u>Showa</u> Denko K.K., Minato-ku, Tokyo (JP) --

Signed and Sealed this
Fifth Day of April, 2011

David J. Kappos
*Director of the United States Patent and Trademark Office*